United States Patent [19]

Hazen

[11] Patent Number: 5,040,381
[45] Date of Patent: Aug. 20, 1991

[54] APPARATUS FOR COOLING CIRCUITS
[75] Inventor: William A. Hazen, Hopkinton, Mass.
[73] Assignee: Prime Computer, Inc., Natick, Mass.
[21] Appl. No.: 511,108
[22] Filed: Apr. 19, 1990
[51] Int. Cl.⁵ .............................................. F25B 21/02
[52] U.S. Cl. .......................................... 62/3.2; 62/3.1;
                                                  136/204; 136/237
[58] Field of Search ................ 62/3.2, 3.3, 3.1, 3.7;
                                      136/203, 204, 237; 357/87

[56]            References Cited
         U.S. PATENT DOCUMENTS

| 2,149,286 | 3/1939  | Graves ............................ 260/2   |
| 2,407,896 | 9/1946  | Myers ............................ 260/78   |
| 2,421,024 | 5/1947  | Frosch et al. .................. 428/350    |
| 2,502,576 | 3/1946  | Lincoln et al. ................ 260/78      |
| 3,412,566 | 11/1968 | Townsend et al. ............ 62/3.2         |
| 3,460,015 | 8/1969  | Hines ............................ 62/3.2   |
| 4,492,730 | 1/1985  | Oishi et al. .................... 165/185   |
| 4,574,879 | 3/1986  | DeGree et al. ................ 428/328      |
| 4,760,325 | 6/1987  | Bakos et al. .................... 428/209   |
| 4,810,563 | 3/1989  | DeGree et al. ................ 428/209      |

OTHER PUBLICATIONS

The Thermal Clad Design Guide, The Bergquist Company (Edina, Minnesota The Bergquist Company, Spring, 1990).
Data Sheets for Thermal CLAD ®.

Primary Examiner—Albert J. Makay
Assistant Examiner—John Sollecito
Attorney, Agent, or Firm—Wolf, Greenfield & Sacks

[57]                ABSTRACT

An apparatus for cooling circuit modules by use of a thermo-electric device which comprises a series of semiconductor regions and etched copper conductors designed to conduct heat in a specified direction by means of the Peltier Effect. The thermo-electric device is sandwiched between two layers of a polymer based, thermally conductive dielectric such as the dielectric used in the manufacture of Thermal Clad TM. The hot layer of Thermal Clad TM (i.e., the layer that receives heat) is laminated directly to a heat sink. The cold layer of Thermal Clad TM is laminated directly to a cold plate which is, in turn, coupled to the circuit module.

17 Claims, 2 Drawing Sheets

APPARATUS FOR COOLING CIRCUITS

FIELD OF THE INVENTION

The invention relates to an apparatus for cooling circuits. More particularly, the invention relates to a thermo-electric apparatus for conducting heat away from a high density circuit module.

BACKGROUND OF THE INVENTION

High density circuit modules in computers and other electronic apparatus generate significant amounts of heat which, if not removed from the circuit, can cause the circuit components to rise to temperatures beyond their rated capacity. Also, even within its rated capacity, circuits commonly can operate at much higher speeds and provide much greater performance at cooler temperatures. For example, in bi-CMOS circuits, if the junction temperature of the silicon die is maintained at $-5°$ C. to $10°$ C., circuit speed can be increased approximately 50%. Numerous apparatus are available for cooling circuit modules. The particular design used in any given situation is highly dependent upon many factors including the amount of heat generated by the circuitry, the ambient temperatures in which the circuitry is to be used, the space available for cooling, hardware, etc.

One known apparatus used in circuit cooling structures is a thermo-electric device. A thermo electric device typically comprises a set of alternately negatively and positively doped semiconductor regions electrically coupled in series and sandwiched between two electrically insulative and thermally conductive layers ($Al_2O_3$ ceramic substrates). When current flows through the semiconductors, heat is conducted from one of the dielectric layers (the cold layer) to the other dielectric layer (the hot layer). In a typical application of a thermo electric device, the cold layer is physically coupled to the module to be cooled while the hot layer is coupled to a thermally conductive heat sink.

FIG. 1 illustrates an exemplary circuit cooling apparatus including a thermo-electric device. A circuit module is shown generally at 12. Circuit module 12 includes a ceramic substrate layer 80. Circuit layer 82 is bonded to substrate 80. FIG. 1 shows a second circuit layer 84 bonded to layer 82, however, the desired circuit design may require more or less than two circuit layer. Finally, silicon die 86 is coupled to the circuit layer 84. The die 86 may be coupled to the circuit layer 84 by epoxy or it may be reflowed with a tin-gold eutectic solder. Other methods are also known. The silicon die 86 can be wire bonded or TAP bonded to the circuit layer 84 for the required electrical connections.

The substrate layer 80 of circuit 12 is coupled to a copper cold plate 14 at interface 16. A layer of thermal grease is applied between the substrate 80 and the cold plate 14 at interface 16. The thermal grease provides a thermally uniform coupling between the substrate 80 and cold plate 14. For instance, the substrate 80 and the cold plate 14 may have their mating surfaces milled flat to approximately $\pm 1/1000$ of an inch. Due to irregularities in the mating surfaces of $\pm 1/1000$ of an inch or less, the two surfaces do not uniformly contact at all places thus forming air gaps in interface 16. The thermal grease fills the air gaps between the mating surfaces of substrate 80 and cold plate 14 providing uniform thermal coupling between the two components. The thermal grease interface 16 is maintained by fixing the circuit module 12 to the copper cold plate 14 by mechanical means such as screws or clamps (not shown).

A thermo-electric device 18 is coupled to the opposite face of cold plate 14, forming interface 20. Thermal grease also is employed in interface 20 to provide uniform thermal coupling between the mating surfaces of thermo-electric device 18 and cold plate 14. An exemplary thermo-electric device sometimes referred to as a heat pump is, Part No. 2CP110050-32(32) manufactured by Material Electronic Products Corp. of Trenton, N.J. This type of device conducts heat in a specified direction by means of the Peltier Effect, a known physical effect by which heat is evolved or absorbed at the junction of two dissimilar metals which carry a small current. Layer 22 of thermo-electric device 18 comprises a thermally conductive dielectric such as alumina, $Al_2O_3$, which is a ceramic. Copper cold plate 14 is coupled to the alumina layer 22 of thermo electric device 18 by mechanical means. This second layer of thermal grease (interface 20) is applied between the cold plate 14 and the alumina layer 22 to eliminate air gaps and provide uniform thermal coupling. Typically, the circuit module 12, the cold plate 14 and the thermo-electric device 18 are coupled together by a single clamping means which holds all three parts together. Within thermo-electric device 18, the next layer is a layer of etched copper 24. The etched copper layer 24 is sometimes referred to as a bus-bar and is coupled to the alumina 22 at interface 26 by means of a lamination process. The etched copper layer 24 is attached at its face opposite alumina layer 22 to a layer of alternately positively and negatively doped semiconductor regions generally represented at 28 in FIG. 1. The alternating positively doped regions 30 and negatively doped regions 32 preferably comprise high grade bismuth telluride in the form of oriented polycrystalline ingots. The semiconductor regions are coupled to the etched copper layer 24 by solder joints 34 which preferably comprise indium tin solder. A second etched copper layer 36 is placed on the other side of semiconductor layer 28. The semiconductor regions are coupled thereto by means of additional indium tin solder joints 34. The etched copper layers (or bus-bars) 24 and 36 are etched to provide a conductive path in which the semiconductor regions are coupled in a series pattern such that current flows successively through a positive semiconductor region 30 in a downward direction from copper layer 36 to copper layer 24, and through a negatively doped semiconductor regions 32 in an upward direction from copper layer 24 to copper layer 36 and so on. Due to the Peltier Effect, the flow of current through the semiconductor regions causes heat to flow upwardly in FIG. 1, away from first alumina layer 22. The upper etched copper layer 36 is coupled to a second alumina layer 38 which receives the heat conducted away from first alumina layer 22. Once again, alumina layer 38 is bonded to the etched copper layer 36 at interlace 40 by a lamination process. Finally, alumina layer 38 is coupled at its face opposite etched copper layer 36 to a heat sink 42. Heat sink 42 typically comprises a heavy mass of thermally conductive metal such as aluminum or copper which is cast in a shape having a very high surface area to mass ratio. Another layer of thermal grease is applied between alumina layer 38 and the heat sink 42 to eliminate the effects of the physical imperfections of the two lapped, mating surfaces. Alumina layer 38 is coupled to the heat sink 42 by mechanical means such as screws 46. In fact, it is common to provide mechanical clamping means, such as screws, to hold together the entire circuit structure including circuit module 12, cold plate 14, thermo-electric device 18 and heat sink 42. A fan may be provided (not shown) to force cooling air through veins 48 of the heat sink 42. In some situations, liquids may be used.

In this prior art circuit cooling apparatus, the multiple interfaces between the various layers, and particularly the interfaces containing thermal grease such as interfaces 16, 20 and 44 create a significant amount of resistance to the flow of heat. It is desirable to reduce the number of layers between the actual circuitry, i.e., the silicon dies and circuit layers of circuit module 12 and the heat sink 42 to increase thermal efficiency.

Therefore, it is an object of the present invention to provide a heat sink apparatus having a reduced number of thermally-resistive layers, thereby reducing the power used by the thermo-electric device to maintain a specified circuit temperature.

It is a further object of the present invention to provide a heat sink apparatus which does not require thermal grease in any of the interfaces between layers.

It is another object of the present invention to provide an improved heat sink apparatus.

It is one more object of the present invention to provide a heat sink apparatus which requires no mechanical means for coupling the various layers together.

It is yet another object of the present invention to provide a heat sink apparatus having increased thermal efficiency.

SUMMARY OF THE INVENTION

The invention comprises an apparatus for cooling circuits using a thermo-electric device comprising a series of semiconductor regions electrically coupled in series by, and sandwiched between, two layers of electrical conductors so as to conduct heat in a specified direction by means of the Peltier Effect. Each of the layers of electrical conductor is laminated directly to separate polymer based, thermally conductive dielectric layers like the dielectric layer used in the manufacture of THERMAL CLAD thermal control substrate, a product of Bergquist, Inc. of Edina, Minn. The dielectric layer which is coupled to the hot side of the thermo-electric device is laminated directly to a heat sink on its opposite face. The other dielectric layer is laminated directly to a copper cold plate which is, in turn, coupled to the circuitry which is to be cooled.

DETAILED DESCRIPTION OF THE INVENTION

Figure 1:
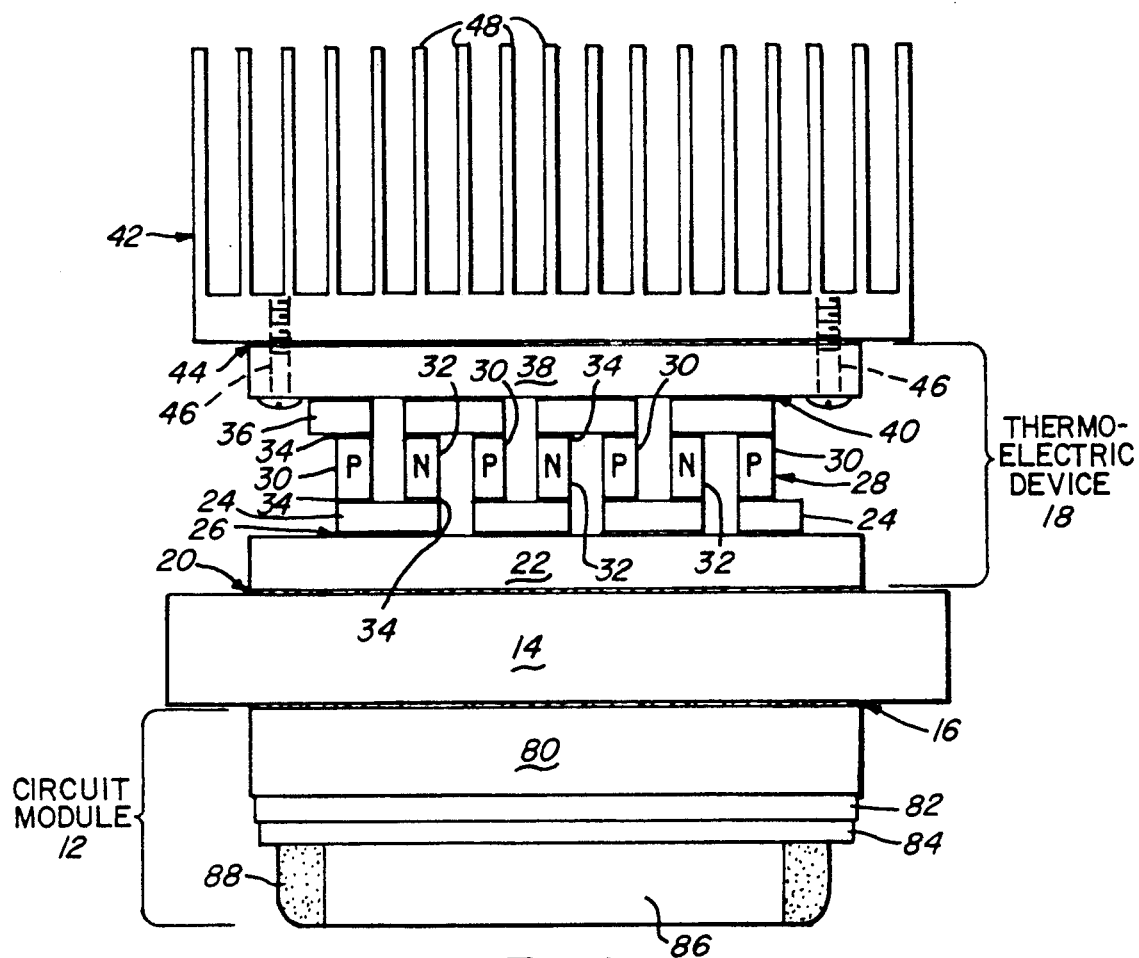
FIG. 1 shows a circuit cooling apparatus of the prior art.
Figure 2:
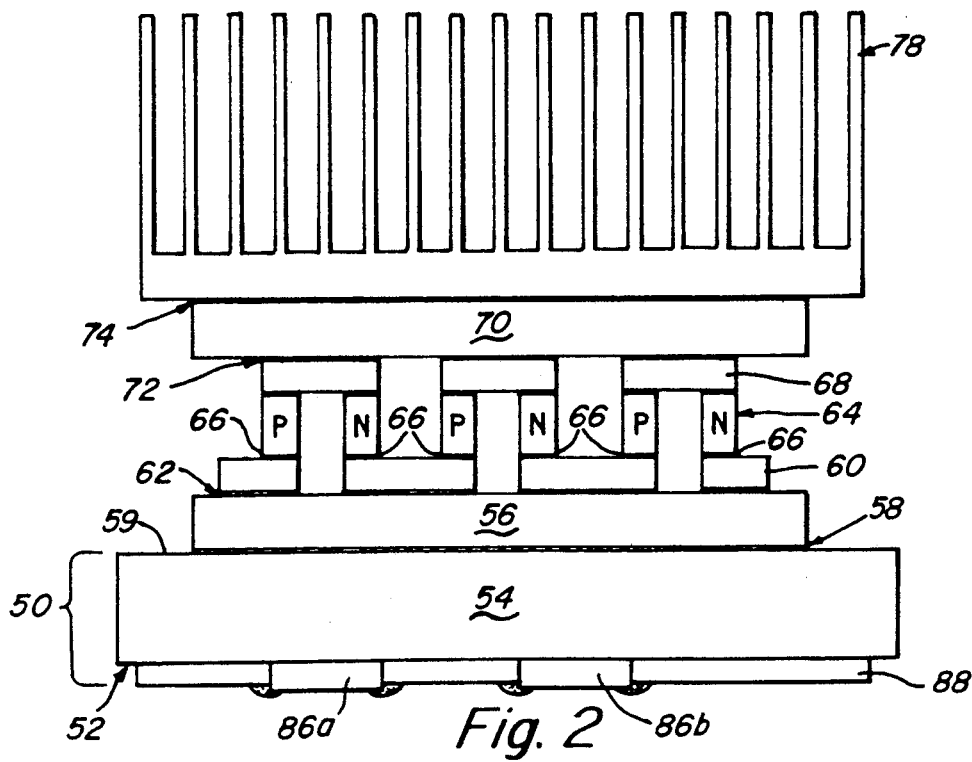
FIG. 2 shows the circuit cooling apparatus of the present invention.

FIG. 2 illustrates the structure of the heat sink of the present invention. In FIG. 2, the circuit module is shown generally 50 and will be described in greater detail hereafter. At this point, however, it will merely be noted that the substrate of the circuit module 50 comprises an aluminum or copper cold plate 54 similar to the copper cold plate 14 shown in the prior art of FIG. 1. Face 59 of cold plate 54 is bonded to a thermally conductive dielectric layer 56 such as the dielectric layer used in the manufacture of THERMAL CLAD thermal control substrate, a product of Bergquist, Inc. of Edina, Minn. (hereinafter referred to as dielectric layer 56). The dielectric layer of THERMAL CLAD thermal control substrate is a 0.003 inch thick polymer having the following properties:

| | |
|---|---|
| Dielectric strength | ~approximately 2500 volts min. |
| Dielectric constant | ~5-6 |
| Thermal conductivity | ~$\beta$ Watt meter$^{-1}$ °K.$^{-1}$ |
| Surface resistivity | ~$1 \times 10^9$ megohms |
| Process temperature | ~350° C. |
| Continuous use temperature | ~180° C. |

All of the properties listed above are approximate. Other laminating dielectrics similar to that of the dielectric layer of THERMAL CLAD thermal control substrate, also may be used. Such dielectrics are typically polyimide, polyamide or epoxy films loaded with particulate solids, and are usually both highly thermally conductive and highly electrically insulative, as described in U.S. Pat. No. 4,810,563. Such films are commercially available from E. I. DuPont de Nemours Corporation of Wilmington, Del. under the trade name "KAPTON M.T." These films are described in U.S. Pat. Nos. 2,149,286; 2,407,896; 2,421,024; and 2,502,576.

The dielectric layer 56 is coupled on one side to the copper cold plate 54 and on the other side to an etched copper circuit layer 60. The dielectric layer 56 is coated (or laminated) on to the surface 59 of the cold plate 54 by a lamination process used by Bergquist, Inc., the manufacturers of THERMAL CLAD thermal control substrate. A one ounce copper layer 60 is laminated to the opposite side of the dielectric layer 56 by the same lamination process. The copper is then subtractively etched away into the desired circuit pattern. In the present invention, the copper circuit layer 60 is etched into a pattern to provide current flow through the semiconductor layer 64 of the thermo-electric device between the negatively doped semi-conductor regions and the positively doped semi-conductor regions of layer 64 in accordance with the Peltier Effect.

The polymer-based, thermally-conductive dielectric layer 56 provides significant advantages over alumina or other ceramics used in the prior art. Unlike alumina or other ceramics, a polymer-based dielectric layer 56 having the above noted properties can be bonded to metal and other objects by means of a lamination process thus eliminating the need for thermal grease and mechanical clamping means.

In addition, the dielectric layer 56, although more thermally resistant than alumina, is only 0.003 inches thick, whereas a similar alumina layer such as alumina layer 22 of FIG. 1 has a thickness on the order of 0.025 inches. Thus, heat conduction through the dielectric layer is much more efficient than through the much thicker path through the alumina layer and thermal grease interface, despite the higher thermal conductivity of the latter.

As in the prior art, the etched copper layer 60 is coupled to a semiconductor layer 64 of the thermo-electric device by indium tin solder at points 66. The semiconductor regions of the semiconductor layer 64 are coupled to a second layer of etched copper 68 by indium tin solder. The etched copper layer 68 is coupled to a second thermally conductive dielectric layer 70 such as the dielectric layer 56 by lamination as mentioned above. Similarly to the first dielectric layer 56, dielectric layer 70 is laminated directly to the heat sink 78 at interface 74 by the same lamination process that is used in interface 58. The second etched copper layer 68 referred to above, is laminated to the dielectric layer 70 and subtractively etched into the desired circuit pattern in the same manner described above with respect to the first etched copper layer 60.

By making use of the dielectric layer of THERMAL CLAD thermal control substrate or other dielectric having similar properties, the three interfaces of the prior art apparatus which required thermal grease and mechanical clamping means, i.e., interfaces 16, 20 and 44 of FIG. 1, are eliminated, thus providing increased thermal efficiency. In addition, mechanical clamping means, such as screws 46 in FIG. 1, for coupling the circuit module to the cold plate, and the cold plate to the thermo-electric device are eliminated, thus providing significant cost and space savings.

Circuit module 50 of FIG. 2 includes other features in accordance with the present invention which provide further increased thermal efficiency, a reduced number of layers and further advantages over the prior art apparatus as exemplified by FIG. 1. Circuit module 50 takes advantage of technology available from Unistructure, Inc. of Irvine, Calif. Unistructure, Inc. utilizes a process which allows the silicon die of a circuit module to be mounted directly on a cold plate such as copper cold plate 14 of FIG. 1, thus eliminating the need for the separate ceramic substrate layer 80. Substrate layer 80 in FIG. 1 is a significant thermal resistance in the path between the circuitry and the heat sink and, therefore, its elimination significantly increases the thermal efficiency of the cooling apparatus.

Utilizing the technology available from Unistructure, Inc. in the present invention as illustrated in FIG. 2, cold plate 54 can be used directly as the substrate of circuit module 50. Silicon dies 86a and 86b can be bonded directly to the cold plate 54 and the circuit layer (or layers) 88 can be constructed around the dies 86a and 86b rather than as a wholly separate layer. However, if the silicon dies are to be bonded directly to the cold plate 54, then the cold plate should be constructed of a copper-tungsten alloy rather than pure copper since, if the die is relatively large (approximately ½ inch square or greater), the thermal mismatch between the copper and silicon may cause the silicon die to crack when its temperature rises The thermal mismatch between certain copper-tungsten alloys and silicon is much smaller, thus eliminating this problem. This design significantly reduces the number of layers and junctions between the heat sink 78 and the silicon dies 86a and 86b. The upper surface 59 of copper cold plate 54 is laminated with thermally conductive dielectric lager 56 as described previously.

Thus, in this embodiment of the invention, three thermal grease junctions, 16, 20 and 44 in FIG. 1, are eliminated as is dielectric substrate layer 80. Further, no mechanical clamping means are necessary. In addition, the silicon die 86 is directly bonded to the cold plate 54 and the circuit layer 88 is built around the die and also bonded to the cold plate 54, thus eliminating the thermally-resistive layer as a level between the die and the heat sink.

It should be understood that the present invention can be practiced by use of only a single dielectric layer adjacent the heat sink (i.e., layer 70) and that alumina or the like could be used as layer 56. However, it is preferable to use the dielectric as both layer 56 and 70 because of the increased thermal efficiency. It should also be understood that, although FIG. 2 illustrates the present invention with respect to a single stage thermo-electric cooling apparatus, the invention is equally applicable to cooling apparatus having two or more layers of thermo-electric devices.

Figure 3:
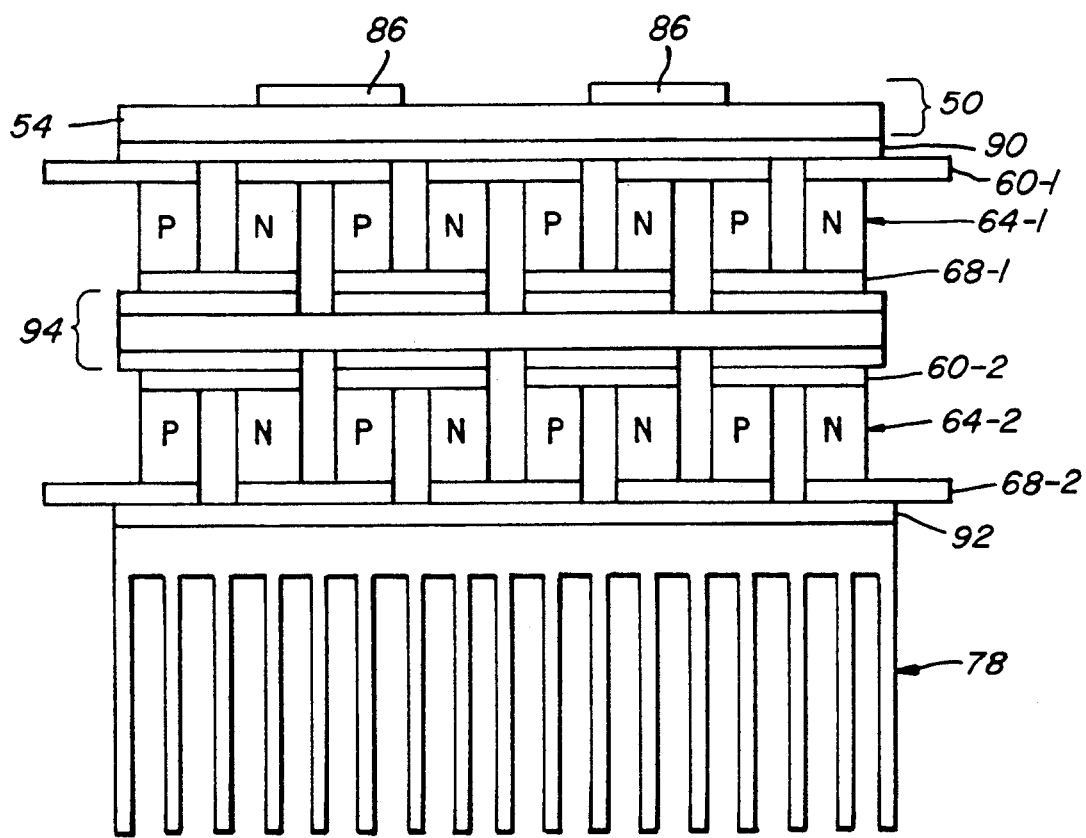
FIG. 3 shows an alternate embodiment of the circuit cooling apparatus of the present invention including a two-stage thermo-electric interface.

FIG. 3 illustrates a circuit cooling apparatus having two stages of thermo-electric devices between the circuit module 50 and the heat sink 78. Each thermo-electric stage comprises a semiconductor layer 64 sandwiched between two layers of etched copper (bus-bars) 60 and 68. Layer 90, between cold plate 54 and circuit layer 60-1 and layer 92 between circuit layer 68-2 and heat sink 78 are a polymer-based thermally-conductive dielectric like the dielectric layer of THERMAL CLAD thermal control substrate, previously described. Plate 94, disposed between the two thermo-electric stages is an alumina substrate metalized on both faces for interfacing to the circuit layers 68-1 and 68-2, respectively. However, it should be understood that the Thermal Clad TM dielectric may also be used as layer 94. Additional thermo-electric stages may be added in a similar manner, if necessary for added cooling.

Having thus described a few particular embodiments of the invention, various alterations, modifications and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. An apparatus for cooling a circuit module comprising:
   a heat sink,
   a thermo-electric device comprising a series of semiconductor regions sandwiched between first and second electrically conductive layers,
   a thin polymer-based dielectric layer having a first face bonded to said heat sink, and a second face bonded to said first electrically conductive layer, for conducting heat from said thermo-electric device towards said heat sink, and
   said second electrically conductive layer coupled to thermally receive heat from said circuit module.

2. An apparatus as set forth in claim 1 wherein said second electrically conductive layer is thermally coupled to said circuit module via a cold plate.

3. An apparatus as set forth in claim 2 wherein said first and second electrically conductive layers comprise etched copper, each layer etched in a pattern so as to electrically couple said semiconductor regions in a series of alternately positively and negatively doped regions.

4. An apparatus as set forth in claim 3 wherein said heat sink is constructed of aluminum.

5. An apparatus as set forth in claim 3 wherein said heat sink is constructed of copper.

6. An apparatus as set forth in claim 3 wherein said circuit module is coextensive with said copper cold plate and said copper cold plate comprises a substrate of said circuit module.

7. An apparatus as set forth in claim 2 wherein said circuit module further comprises silicon die bonded directly to said cold plate and at least one circuit layer coupled to said cold plate.

8. An apparatus as set forth in claim 7 wherein said cold plate is constructed of a copper-tungsten alloy.

9. A thermo-electric apparatus for cooling a circuit module, comprising:
- a cold plate coupled to said circuit module,
- a first layer of etched copper,
- a first thin polymer-based dielectric layer having a first face bonded to said cold plate, and a second face bonded to said first layer of etched copper, for conducting heat from said cold plate towards said first layer of etched copper,
- a second layer of etched copper,
- a series of alternately positively and negatively doped semiconductor regions coupled between said first and second etched copper layers to cause heat to flow, by means of the Peltier Effect, away from said first etched copper layer and toward said second etched copper layer,
- a heat sink,
- a second thin polymer-based dielectric layer having a first face bonded to said second etched copper layer, and a second face bonded to said heat sink for conducting heat from said second etched copper layer towards said heat sink.

10. An apparatus as set forth in claim 9 wherein said first and second dielectric layers are bonded to said first and second etched copper layers, respectively, by means of a lamination process.

11. An apparatus as set forth in claim 10 wherein said first and second dielectric layers are bonded to said copper cold plate and said heat sink, respectively, by means of said lamination process.

12. An apparatus as set forth in claim 11 wherein said cold plate is constructed of copper.

13. An apparatus as set forth in claim 12 wherein said heat sink is constructed of aluminum.

14. An apparatus as set forth in claim 12 wherein said heat sink is constructed of copper.

15. An apparatus as set forth in claim 12 wherein said semiconductor regions are coupled to said first and second etched copper layer by means of indium tin solder.

16. An apparatus as set forth in claim 15 wherein said circuit module is coextensive with said cold plate and said cold plate is constructed of a copper-tungsten alloy, said cold plate comprising a substrate of said circuit module.

17. An apparatus as set forth in claim 16 wherein said circuit module further comprises silicon die bonded directly to said cold plate and at least one circuit layer coupled to said cold plate.

* * * * *